United States Patent [19]

Tang

[11] Patent Number: 5,757,208
[45] Date of Patent: May 26, 1998

[54] PROGRAMMABLE ARRAY AND METHOD FOR ROUTING POWER BUSSES THEREIN

[75] Inventor: Dandas K. Tang, Chandler, Ariz.

[73] Assignee: Motorola, Inc., Schaumburg, Ill.

[21] Appl. No.: 641,397

[22] Filed: May 1, 1996

[51] Int. Cl.$^6$ .................................. H03K 19/177
[52] U.S. Cl. ...................... 326/41; 326/47; 326/101
[58] Field of Search ........................ 326/37, 39–41,
326/47, 101, 102–103, 44–45, 49–50; 257/207

[56] References Cited

U.S. PATENT DOCUMENTS

| | | |
|---|---|---|
| 4,511,914 | 4/1985 | Remedi et al. . |
| 4,661,815 | 4/1987 | Takayama et al. ............ 326/41 |
| 4,780,846 | 10/1988 | Tanabe et al. ............ 326/41 |
| 5,079,612 | 1/1992 | Takamoto et al. ............ 257/207 |

*Primary Examiner*—Jon Santamauro
*Attorney, Agent, or Firm*—Rennie William Dover; Ziye Zhou

[57] ABSTRACT

A programmable array (10) includes an array (11) of transistor cells, output cells (26, 28, 32, 34), and two internal power busses (17, 18) which are coupled to the array (11) of transistor cells. The programmable array also includes eight output power busses (35, 36, 37, 38, 41, 42, 43, 44) coupled to the output cells (26, 28, 32, 34). The two internal power busses (17, 18) are coupled to two corresponding output power busses (35, 36) via two coupling switches (55, 56). Further, the output power busses (35, 36, 37, 41, 42, 43, 44) are coupled to each other via eight switches (45, 46, 47, 48, 51, 52, 53, 54). Different power bus routings of the programmable array (10) are realized by controlling the two coupling switches (55, 56) and the eight switches (45, 46, 47, 48, 51, 52, 53, 54).

20 Claims, 1 Drawing Sheet

PROGRAMMABLE ARRAY AND METHOD FOR ROUTING POWER BUSSES THEREIN

BACKGROUND OF THE INVENTION

The present invention relates, in general, to programmable arrays and, more particularly, to power bus routing for programmable arrays.

A programmable array such as a programmable gate array typically includes a uniform pattern of hundreds or thousands of unconnected transistor level gate cells. Each cell is capable of being interconnected with other cells in accordance with interconnection data stored in a memory unit of the programmable array. Thus, a programmable array may be programmed to realize many custom circuit functions.

When a gate array has a large number of output cells, a large current spike at the output may generate a noise level high enough to create logic errors in the internal circuitry of the array. An approach for isolating internal circuitry from the noise generated by output circuitry involves separating the power busses for input/internal circuitry from the power busses for output circuitry. A pair of internal power busses and a pair of output power busses are used to provide power for the input/internal circuitry and the output circuitry, respectively, thereby isolating the internal circuitry from the noise generated by the output circuitry.

For a programmable array, the gate array may be programmed to have different configurations and circuit functions. In order to achieve optimum performance, it is usually preferred to have different power bus configurations to supply power for different cell configurations and circuit functions. By way of example, for a configuration with a small number of output cells, one pair of power busses can be used to supply power to both input/internal circuitry and output circuitry. On the other hand, for a configuration with a very large number of output cells, more than one pair of output power busses may be needed to provide sufficient noise isolation.

Accordingly, it would be advantageous to have a programmable array and a method for routing power busses in the programmable array. It is desirable to be able to dynamically configure the power bus routings and match different power bus routings to different cell configurations and different circuit functions of the programmable array for optimum performance and cost efficiency.

DETAILED DESCRIPTION OF THE DRAWINGS

Figure 1:
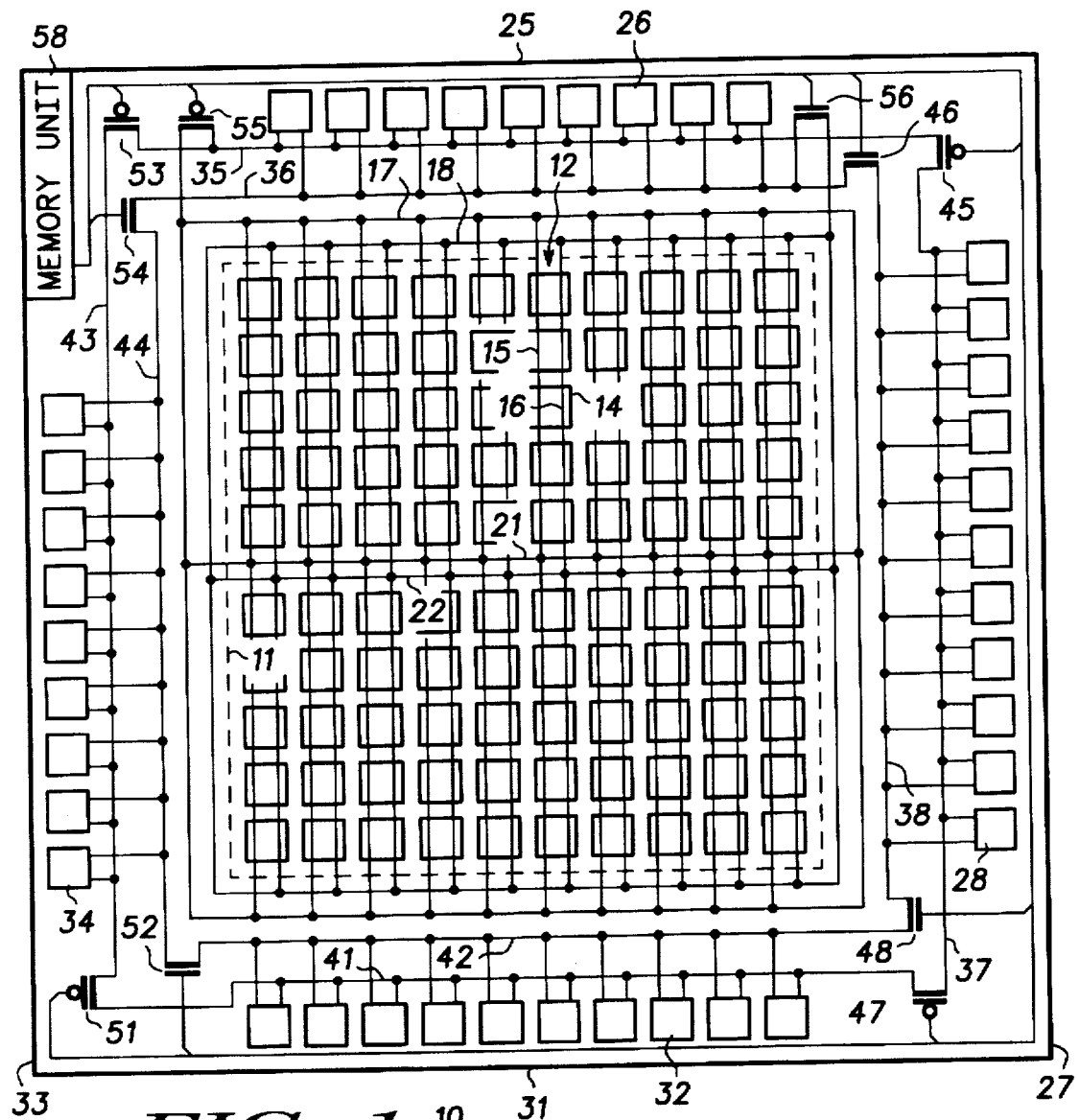
FIG. 1 is a block diagram of a programmable array in a representative arrangement in accordance with an embodiment of the present invention.

FIG. 1 is a block diagram of a programmable array 10 in a representative arrangement in accordance with an embodiment of the present invention. Programmable array 10 includes an array 11 of transistor level functional cells. By way of example, programmable array 10 is a programmable gate array and array 11 is an array of transistor level logic gate cells. Cells in array 11 are arranged in N columns, where N is an integer. A column 12 is shown in FIG. 1 as a representative column in array 11 and a cell 14 is shown in FIG. 1 as a representative cell in column 12. It should be noted that, although array 11 is shown in FIG. 1 as including ten columns, each column having ten cells, any number of columns and cells may be used to practice the present invention.

Programmable array 10 also includes N pairs of first and second power busses, each pair adjacent one column of cells. Power busses 15 and 16 are shown in FIG. 1 as a representative pair of first and second power busses adjacent column 12. The pair of first and second power busses adjacent a particular column are selectively coupled to the cells in that column. For example, power busses 15 and 16 are selectively coupled to the cells, such as cell 14, in column 12. Further, the first and second power busses adjacent each of the N columns, such as power busses 15 and 16 adjacent column 12, are coupled to internal power busses 17 and 18, respectively. By way of example, internal power bus 17 is coupled for receiving a supply voltage of $V_{DD}$ and internal power bus 18 is coupled for receiving a supply voltage of $V_{SS}$. Conventionally, $V_{DD}$ is a voltage potential more positive than $V_{SS}$. Therefore, internal power bus 17 is also referred to as an internal upper voltage bus or an internal supply voltage bus. Likewise, internal power bus 18 is also referred to as an internal lower voltage bus or an internal ground bus.

Programmable array 10 further includes a pair of power strips 21 and 22, extending substantially perpendicularly to the N columns of cells. Power strip 21 is coupled to internal power bus 17 and to the first power bus adjacent each of the N columns of cells, such as power bus 15 adjacent column 12. Likewise, power strip 22 is coupled to internal power bus 18 and to the second power bus adjacent each of the N columns of cells, such as power bus 16 adjacent column 12. Power strips 21 and 22 provide increased current availability to the cells in array 11. It should be noted that programmable array 10 is not limited to having one pair of power strips as shown in FIG. 1. Depending on the desired current availability to the cells in array 11, programmable array 10 may include any number of pairs of power strips that serve the same function as the pair of power strips 21 and 22. It should also be noted that power strips 21 and 22 are not limited to extending across all N columns in array 11. Some or all power strips may extend across only a portion of the N columns and are selectively coupled to the power busses adjacent some of the N columns of the cells in array 11. The number and configuration of power strips as well as the selective coupling of the power strips to the power busses are determined in accordance with the desired cell configuration and circuit function.

Programmable array 10 further includes a plurality of output cells for generating the output signals of programmable array 10. The plurality of output cells receive signals such as, for example, logic signals, from array 11 of cells. Output cells 26, 28, 32, and 34 are shown in FIG. 1 as representative output cells along sides 25, 27, 31, and 33, respectively, of programmable array 10. The output cells along side 25 are coupled to output power busses 35 and 36, which extend along side 25. The output cells along side 27 are coupled to output power busses 37 and 38, which extend along side 27. The output cells along side 31 are coupled to output power busses 41 and 42, which extend along side 31. The output cells along side 33 are coupled to output power busses 43 and 44, which extend along side 33. By way of example, output power busses 35, 37, 41, and 43 are coupled for receiving a supply voltage of $V_{DD}$ and are, therefore, also referred to as upper voltage busses or supply voltage busses. Similarly, output power busses 36, 38, 42, and 44 are coupled for receiving a supply voltage of $V_{SS}$ and are, therefore, also referred to as lower voltage busses or ground busses.

Output power busses 35 and 36 are coupled to output power busses 37 and 38, respectively, via a p-channel insulated gate field effect transistor (IGFET) 45 and an n-channel IGFET 46, respectively. Output power busses 37 and 38 are coupled to output power busses 41 and 42, respectively, via a p-channel IGFET 47 and an n-channel IGFET 48, respectively. Output power busses 41 and 42 are coupled to output power busses 43 and 44, respectively, via a p-channel IGFET 51 and an n-channel IGFET 52, respectively. Output power busses 43 and 44 are coupled to output power busses 35 and 36, respectively, via a p-channel IGFET 53 and an n-channel IGFET 54, respectively. More particularly, the source electrodes of p-channel IGFETs 45, 47, 51, and 53 are connected to output power busses 35, 37, 41, and 43, respectively, and the drain electrodes of p-channel IGFETs 45, 47, 51, and 53 are connected to output power busses 37, 41, 43, and 35, respectively. Likewise, the source electrodes of n-channel IGFETs 46, 48, 52, and 54 are connected to output power busses 36, 38, 42, and 44, respectively, and the drain electrodes of n-channel IGFETs 46, 48, 52, and 54 are connected to output power busses 38, 42, 44, and 36, respectively. IGFETs 45, 47, 51, and 53 serve as switches for coupling upper voltage busses together and are, therefore, also referred to as upper or high side switches. The gate electrodes of IGFETs 45, 47, 51, and 53 are coupled for receiving their respective high side switch control signals from a memory unit 58. IGFETs 46, 48, 52, and 54 serve as switches for coupling lower voltage busses together and are, therefore, also referred to as lower or low side switches. The gate electrodes of IGFETs 46, 48, 52, and 54 are coupled for receiving their respective low side switch control signals from memory unit 58. It should be noted that the number of output power busses in programmable array 10 is not limited to being eight as shown in FIG. 1. Programmable array 10 may include any even number of output power busses, i.e., two output power busses, four output power busses, six output power busses, eight output power busses, ten output power busses, etc. For example, programmable array 10 may have two output power busses coupled to all of the output cells. When programmable array 10 has only two output power busses, switches similar to IGFETs 45, 46, 47, 48, 51, 52, 53, and 54 are not present. Preferably, half of the output power busses provide a supply voltage of $V_{DD}$ to the output cells and half of the output power busses provide a supply voltage of $V_{SS}$ to the output cells. The output power busses that provide the supply voltage $V_{DD}$ to the output cells are referred to as upper voltage busses and the output power busses that provide the supply voltage $V_{SS}$ to the output cells are referred to as lower voltage busses. To achieve maximum programming flexibility, the number of switches such as IGFETs 45, 46, 47, 48, 51, 52, 53, and 54 is preferably equal to the number of output power busses. Half of the switches couple the upper voltage busses together and are referred to as upper or high side switches. The other half of the switches couple the lower voltage busses together and are referred to as lower or low side switches.

Output power busses 35 and 36 are further coupled to internal power busses 17 and 18, respectively, via a p-channel IGFET 55 and an n-channel IGFET 56, respectively. More particularly, the source electrodes of IGFETs 55 and 56 are connected to output power busses 35 and 36, respectively, and the drain electrodes of IGFETs 55 and 56 are connected to internal power busses 17 and 18, respectively. IGFET 55 serves as a switch which couples output power bus 35 to internal power bus 17. IGFET 56 serves as a switch which couples output power bus 36 to internal power bus 18. Therefore, IGFETs 55 and 56 are also referred to as coupling switches. The gate electrodes of IGFETs 55 and 56 are coupled for receiving their respective coupling switch control signals from memory unit 58. It should be noted that the number of coupling switches in programmable array 10 is not limited to being two as shown in FIG. 1. Depending on the number of output power busses, programmable array 10 may include any even number of coupling switches. For example, programmable array 10 of FIG. 1 may include eight coupling switches grouped into four pairs. The first pair couple output power busses 35 and 36 to internal power busses 17 and 18, respectively, the second pair couple output power busses 37 and 38 to internal power busses 17 and 18, respectively, the third pair couple output power busses 41 and 42 to internal power busses 17 and 18, respectively, and the fourth pair couple output power busses 43 and 44 to internal power busses 17 and 18, respectively.

Although FIG. 1 shows IGFETs 45, 46, 47, 48, 51, 52, 53, 54, 55, and 56 as insulated gate field effect transistors, this is not a limitation of the present invention. IGFETs 45, 46, 47, 48, 51, 52, 53, 54, 55, and 56 may be replaced by any type of switches having control electrodes and current conducting electrodes such as, for example, bipolar transistors, metal semiconductor field effect transistors, or the like. As those skilled in the art are aware, when using an IGFET as a switch, the gate electrode of the IGFET corresponds to the control electrode of the switch, and the source and drain electrodes of the IGFET correspond to the current conducting electrodes of the switch. IGFETs 45, 46, 47, 48, 51, 52, 53, 54, 55, and 56 may also be replaced by antifuses. For example, an antifuse in place of IGFET 55 serves as an one time switch between output power bus 35 and internal power bus 17. As those skilled in the art are aware, the antifuse is initially nonconductive and output power bus 35 is electrically isolated from internal power bus 17. To electrically couple output power bus 35 to internal power bus 17, a voltage of, for example, 18 volts, is applied to the antifuse. Thus, a current flows through the antifuse and the antifuse becomes conductive, thereby coupling output power bus 35 to internal power bus 17.

Memory unit 58 receives data for configuring programmable array 10 from an external source (not shown in FIG. 1) such as, for example, an erasable programmable read only memory (EPROM) unit. The data received by and stored in memory unit 58 determine the state of IGFETs 45, 46, 47, 48, 51, 52, 53, 54, 55, and 56, as well as the configuration of and interconnection among the cells in array 11 and the output cells.

In a first configuration, programmable array 10 has a small number of output cells coupled to array 11 for generating the output signals of programmable array 10, and the noise generated by the output cells is sufficiently small so that it does not affect the logic states of the gate cells in array 11. Thus, isolating cells in array 11 from the noise generated by the output cells is unnecessary. To turn on IGFETs 45, 46, 47, 48, 51, 52, 53, 54, 55, and 56, memory unit 58 transmits a logic low voltage level to the gate electrodes of p-channel IGFETs 45, 47, 51, 53, and 55 and a logic high voltage level to the gate electrodes of n-channel IGFETs 46, 48, 52, 54, and 56. All upper voltage busses, i.e., output power busses 35, 37, 41, and 43, and internal power bus 17 are coupled together. Similarly, all lower voltage busses, i.e., output power busses 36, 38, 42, and 44, and internal power bus 18 are coupled together. Programmable array 10 in the first configuration uses only two power pin-outs (not shown) connected to the power leads of a semiconductor chip (not shown) that includes programmable array 10. One power pin-out provides the voltage $V_{DD}$ to output power bus 35 and the other power pin-out provides the voltage $V_{SS}$ to output power bus 36.

In a second configuration of programmable array 10, the noise generated by the output cells is sufficient to interfere with the logic states of the gate cells in array 11. Accordingly, it is desirable to isolate the cells in array 11 from the noise generated by the output cells by turning off IGFETs 55 and 56. To turn off IGFETs 55 and 56, memory unit 58 transmits a logic high voltage level to the gate electrode of p-channel IGFET 55 and a logic low voltage level to the gate electrode of n-channel IGFET 56. In the second configuration, the noise generated by the output cells along a particular side, e.g., side 25, is not sufficient to interfere with the operation of the output cells along the other three sides, i.e., sides 27, 31, and 33. Therefore, it is not necessary to isolate the output cells along that particular side from those along the other three sides. To turn on IGFETs 45, 46, 47, 48, 51, 52, 53, and 54, memory unit 58 transmits a logic low voltage level to the gate electrodes of p-channel IGFETs 45, 47, 51, and 53 and a logic high voltage level to the gate electrodes of n-channel IGFETs 46, 48, 52, and 54. All upper voltage busses, i.e., output power busses 35, 37, 41, and 43 are coupled together and decoupled from internal power bus 17. Likewise, all lower voltage busses, i.e., output power busses 36, 38, 42, and 44 are coupled together and decoupled from internal power bus 18. Thus, programmable array 10 in the second configuration uses four power pin-outs (not shown) connected to the power leads of the semiconductor chip (not shown) that includes programmable array 10. The first power pin-out provides the voltage $V_{DD}$ to output power bus 35; the second power pin-out provides the voltage $V_{SS}$ to output power bus 36; the third power pin-out provides the voltage $V_{DD}$ to internal power bus 17; and the fourth power pin-out provides the voltage $V_{SS}$ to internal power bus 18.

In a third configuration of programmable array 10, the noise generated by the output cells is sufficient to interfere with the logic states of the gate cells in array 11. Accordingly, it is desirable to isolate the cells in array 11 from the noise generated by the output cells. Further, in the third configuration, the noise generated by the output cells along one side, e.g., output cell 26 along side 25, interferes with the operation of the output cells along another side, e.g., output cell 28 along side 27. Accordingly, it is also desirable to isolate the output cells along the two sides from each other. One approach of achieving the desired noise isolation is to turn off IGFETs 45, 46, 51, 52, 55, and 56 and to turn on IGFETs 47, 48, 53, and 54. Therefore, memory unit 58 is programmed to transmit a logic high voltage level to the gate electrodes of p-channel IGFETs 45, 51, and 55, a logic low voltage level to the gate electrodes of n-channel IGFETs 46, 52, and 56, a logic low voltage level to the gate electrodes of p-channel IGFETs 47 and 53, and a logic high voltage level to the gate electrodes of n-channel IGFETs 48 and 54. When IGFETs 55 and 56 are turned off, internal power busses 17 and 18 are decoupled from output power busses 35 and 36, respectively. When IGFETs 47 and 48 are turned on, output power busses 37 and 38 are coupled to output power busses 41 and 42, respectively. When IGFETs 53 and 54 are turned on, output power busses 43 and 44 are coupled to output power busses 35 and 36, respectively. When IGFETs 45, 46, 51, and 52 are turned off, output power busses 35 and 36 are decoupled from output power busses 37 and 38, respectively. Thus, programmable array 10 in the third configuration uses six power pin-outs (not shown) connected to the power leads of the semiconductor chip (not shown) that includes programmable array 10. The first power pin-out provides the voltage $V_{DD}$ to output power bus 35; the second power pin-out provides the voltage $V_{SS}$ to output power bus 36; the third power pin-out provides the voltage $V_{DD}$ to output power bus 37; the fourth power pin-out provides the voltage $V_{SS}$ to output power bus 38; the fifth power pin-out provides the voltage $V_{DD}$ to internal power bus 17; and the sixth power pin-out provides the voltage $V_{SS}$ to internal power bus 18.

By controlling the states of IGFETs 45, 46, 47, 48, 51, 52, 53, 54, 55, and 56, output power busses 35, 36, 37, 38, 41, 42, 43, and 44, and internal power busses 17 and 18 are configurable into a variety of routings. For example, if IGFETs 45, 46, 47, 48, 51, 52, 53, 54, 55, and 56 are all turned off, the cells in array 11 are isolated from the output cells and the output cells along each of the four sides of programmable array 10 are isolated from the output cells along any other side. This power bus routing provides the maximum noise isolation in programmable array 10. In this power bus routing, programmable array 10 uses ten power pin-outs (not shown) connected to the power lead of the semiconductor chip (not shown) that includes programmable array 10. Five power pin-outs provide the voltage $V_{DD}$ to internal power bus 17 and output power busses 35, 37, 41, and 43 and the other five power pin-outs provide the voltage $V_{SS}$ to internal power bus 18 and output power busses 36, 38, 42, and 44.

Figure 2:
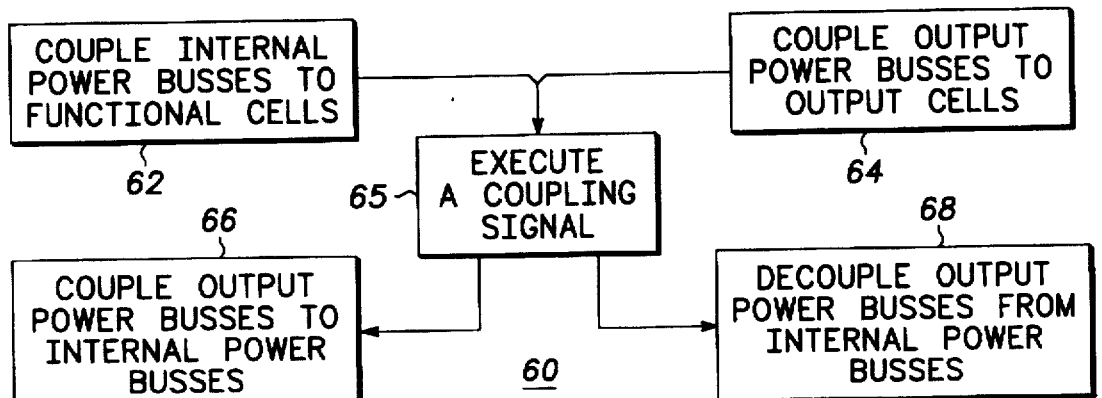
FIG. 2 is a flow chart of a method for dynamically routing power busses in a programmable array in accordance with the present invention.

FIG. 2 is a flow chart 60 of a method for dynamically routing power busses in a programmable array in accordance with the present invention. The programmable array includes a plurality of functional cells, such as, for example, logic gate cells, and a plurality of output cells. The method starts with the step of coupling internal power busses to the functional cells (reference number 62) and coupling output power busses to the output cells (reference number 64). A power bus routing signal programmed into a memory unit of the programmable array is executed (reference number 65). The coupling state between the internal power busses and the output power busses is determined in accordance with the power bus routing signal. Therefore, the power bus routing signal is also referred to as a coupling signal. If the noise generated by the output cells does not interfere with the operation of the functional cells, the output power busses are coupled to the internal power busses in response to the power bus routing signal being in a first state (reference number 66). Otherwise, the output power busses are decoupled from the internal power busses in response to the power bus routing signal being in a second state (reference number 68). It should be noted that the output power busses may be comprised of several segments which are coupled to each other via output power bus routing switches. One segment of each output power bus is either coupled to or decoupled from another segment of the output power bus by controlling the output power bus routing switches.

By now it should be appreciated that a programmable array and a method for dynamically routing power busses in the programmable array have been provided. In accordance with the present invention, the power busses in the programmable array are comprised of internal power busses and output power busses which are coupled to the internal power busses via switches. Further, the output power busses are partitioned into several segments coupled to each other via switches. By controlling the switches between the internal power busses and the output power busses and the switches between different segments of the output power busses, the power busses in the programmable array may be configured into a variety of power bus configurations. Thus, an end user of the programmable array is able to dynamically match different power bus routings with different circuit functions of the programmable array for optimum performance and cost efficiency.

I claim:

1. A programmable array, comprising:
   an array of functional cells;
   a first internal power bus coupled to the array of functional cells;
   a second internal power bus coupled to the array of functional cells;
   a first output cell;
   a first output power bus coupled to the first output cell;
   a second output power bus coupled to the first output cell;
   a first coupling switch having a control electrode coupled for receiving a first coupling switch control signal, a first current conducting electrode coupled to the first output power bus, and a second current conducting electrode coupled to the first internal power bus; and
   a second coupling switch having a control electrode coupled for receiving a second coupling switch control signal, a first current conducting electrode coupled to the second output power bus, and a second current conducting electrode coupled to the second internal power bus.

2. The programmable array of claim 1, wherein a functional cell in the array of functional cells is a logic gate cell.

3. The programmable array of claim 1, further comprising a memory unit for storing the first and second coupling switch control signals.

4. The programmable array of claim 1, further comprising:
   a second output cell;
   a third output power bus coupled to the second output cell;
   a fourth output power bus coupled to the second output cell;
   a first switch having a control electrode coupled for receiving a first control signal, a first current conducting electrode coupled to the first output power bus, and a second current conducting electrode coupled to the third output power bus; and
   a second switch having a control electrode coupled for receiving a second control signal, a first current conducting electrode coupled to the second output power bus, and a second current conducting electrode coupled to the fourth output power bus.

5. The programmable array of claim 4, further comprising:
   a third output cell;
   a fifth output power bus coupled to the third output cell;
   a sixth output power bus coupled to the third output cell;
   a third switch having a control electrode coupled for receiving a third control signal, a first current conducting electrode coupled to the third output power bus, and a second current conducting electrode coupled to the fifth output power bus; and
   a fourth switch having a control electrode coupled for receiving a fourth control signal, a first current conducting electrode coupled to the fourth output power bus, and a second current conducting electrode coupled to the sixth output power bus.

6. The programmable array of claim 5, further comprising:
   a fourth output cell;
   a seventh output power bus coupled to the fourth output cell;
   an eighth output power bus coupled to the fourth output cell;
   a fifth switch having a control electrode coupled for receiving a fifth control signal, a first current conducting electrode coupled to the fifth output power bus, and a second current conducting electrode coupled to the seventh output power bus;
   a sixth switch having a control electrode coupled for receiving a sixth control signal, a first current conducting electrode coupled to the sixth output power bus, and a second current conducting electrode coupled to the eighth output power bus;
   a seventh switch having a control electrode coupled for receiving a seventh control signal, a first current conducting electrode coupled to the seventh output power bus, and a second current conducting electrode coupled to the first output power bus; and
   an eighth switch having a control electrode coupled for receiving an eighth control signal, a first current conducting electrode coupled to the eighth output power bus, and a second current conducting electrode coupled to the second output power bus.

7. The programmable array of claim 6, further comprising a memory unit for storing the first and second coupling switch control signals, and the first, second, third, fourth, fifth, sixth, seventh, and eighth control signals.

8. The programmable array of claim 1, wherein:
   the array of functional cells includes functional cells arranged in a plurality of columns of functional cells, a column of functional cells in the plurality of columns of functional cells having first and second power busses extending along the column of functional cells and coupled to at least one functional cell in the column of functional cells;
   the first internal power bus is coupled to the array of functional cells via the first power bus of the column of functional cells; and
   the second internal power bus is coupled to the array of functional cells via the second power bus of the column of functional cells.

9. The programmable array of claim 8, further comprising at least one pair of power strips, a pair of power strips of the at least one pair of power strips including:
   a first power strip which couples the first internal power bus to the first power bus of the column of functional cells; and
   a second power strip which couples the second internal power bus to the second power bus of the column of functional cells.

10. A programmable gate array, comprising:
    an array of transistor cells arranged in N columns, wherein N is an integer, each of the N columns of transistor cells having first and second power busses extending along each of the N columns of transistor cells and selectively coupled to at least one transistor cell in each of the N columns of transistor cells;
    an internal upper voltage bus coupled to the first power bus of each of the N columns of transistor cells;
    an internal lower voltage bus coupled to the second power bus of each of the N columns of transistor cells;
    a plurality of output cells which receive logic signals from the array of transistor cells and generate output signals of the programmable gate array accordingly;

a first upper voltage bus coupled to a first output cell of the plurality of output cells;

a first lower voltage bus coupled to the first output cell of the plurality of output cells;

a first coupling switch having a control electrode coupled for receiving a first coupling switch control signal, a first current conducting electrode coupled to the first upper voltage bus, and a second current conducting electrode coupled to the internal upper voltage bus;

a second coupling switch having a control electrode coupled for receiving a second coupling switch control signal, a first current conducting electrode coupled to the first lower voltage bus, and a second current conducting electrode coupled to the internal lower voltage bus; and a memory unit which stores the first and second coupling switch control signals.

11. The programmable gate array of claim 10, further comprising:

a second upper voltage bus coupled to a second output cell of the plurality of output cells;

a second lower voltage bus coupled to the second output cell of the plurality of output cells;

a first high side switch having a control electrode coupled for receiving a first high side switch control signal, a first current conducting electrode coupled to the first upper voltage bus, and a second current conducting electrode coupled to the second upper voltage bus; and a first low side switch having a control electrode coupled for receiving a first low side switch control signal, a first current conducting electrode coupled to the first lower voltage bus, and a second current conducting electrode coupled to the second lower voltage bus.

12. The programmable gate array of claim 11, further comprising:

a third upper voltage bus coupled to a third output cell of the plurality of output cells;

a third lower voltage bus coupled to the third output cell of the plurality of output cells;

a second high side switch having a control electrode coupled for receiving a second high side switch control signal, a first current conducting electrode coupled to the second upper voltage bus, and a second current conducting electrode coupled to the third upper voltage bus; and a second low side switch having a control electrode coupled for receiving a second low side switch control signal, a first current conducting electrode coupled to the second lower voltage bus, and a second current conducting electrode coupled to the third lower voltage bus.

13. The programmable gate array of claim 12, further comprising:

a fourth upper voltage bus coupled to a fourth output cell of the plurality of output cells;

a fourth lower voltage bus coupled to the fourth output cell of the plurality of output cells;

a third high side switch having a control electrode coupled for receiving a third high side switch control signal, a first current conducting electrode coupled to the third upper voltage bus, and a second current conducting electrode coupled to the fourth upper voltage bus; and a third low side switch having a control electrode coupled for receiving a third low side switch control signal, a first current conducting electrode coupled to the third lower voltage bus, and a second current conducting electrode coupled to the fourth lower voltage bus.

14. The programmable gate array of claim 13, further comprising:

a fourth high side switch having a control electrode coupled for receiving a fourth high side switch control signal, a first current conducting electrode coupled to the fourth upper voltage bus, and a second current conducting electrode coupled to the first upper voltage bus; and a fourth low side switch having a control electrode coupled for receiving a fourth low side switch control signal, a first current conducting electrode coupled to the fourth lower voltage bus, and a second current conducting electrode coupled to the first lower voltage bus.

15. The programmable gate array of claim 14, wherein the memory unit further stores the first, second, third, fourth high side switch control signals, and the first, second, third, fourth low side switch control signals.

16. The programmable gate array of claim 10, further comprising at least one pair of power strips, a pair of power strips of the at least one pair of power strips including:

a first power strip extending substantially perpendicular to the N columns of transistor cells and selectively coupling the internal upper voltage bus to the first power bus of at least one column in the N columns of transistor cells; and a second power strip extending substantially parallel to the first power strip and selectively coupling the internal lower voltage bus to the second power bus of the at least one column in the N columns of transistor cells.

17. A method for routing power busses in a programmable array having a plurality of functional cells and a plurality of output cells, comprising the steps of:

coupling first and second internal power busses to the plurality of functional cells;

coupling first and second output power busses to a first output cell of the plurality of output cells;

coupling the first and second output power busses to the first and second internal power busses, respectively, in response to a first coupling switch control signal; and decoupling the first and second output power busses from the first and second internal power busses, respectively, in response to a second coupling switch control signal.

18. The method for routing power busses as claimed in claim 17, wherein:

the step of coupling the first and second output power busses to the first and second internal power busses, respectively, further includes the step of coupling the first and second output power busses to first and second voltage levels, respectively; and the step of decoupling the first and second output power busses from the first and second internal power busses, respectively, further includes the steps of coupling the first and second output power busses to the first and second voltage levels, respectively, and coupling the first and second internal power busses to the first and second voltage levels, respectively.

19. The method for routing power busses as claimed in claim 17, further comprising the steps of:

coupling third and fourth output power busses to a second output cell of the plurality of output cells to provide power to the second output cell;

coupling the first and second output power busses to the third and fourth output power busses, respectively, in response to a first control signal; and decoupling the first and second output power busses from the third and fourth output power busses, respectively, in response to a second control signal.

20. The method for routing power busses as claimed in claim 19, further comprising the step of storing the first and second coupling switch control signals and the first and second control signals in a memory unit.

* * * * *